United States Patent
Li et al.

(10) Patent No.: US 9,607,953 B1
(45) Date of Patent: Mar. 28, 2017

(54) SEMICONDUCTOR PACKAGE WITH ISOLATION WALL

(71) Applicant: FREESCALE SEMICONDUCTOR, INC., Austin, TX (US)

(72) Inventors: Lu Li, Gilbert, AZ (US); Hamdan Ismail, Seremban (MY); Samy R. N. Naidu, Puchong (MY); Mahesh Shah, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/052,229

(22) Filed: Feb. 24, 2016

(51) Int. Cl.
| | |
|---|---|
| *H01L 27/00* | (2006.01) |
| *H01L 23/66* | (2006.01) |
| *H01L 23/31* | (2006.01) |
| *H01L 25/18* | (2006.01) |
| *H01L 25/065* | (2006.01) |
| *H01L 29/49* | (2006.01) |
| *H01L 23/552* | (2006.01) |
| *H01L 21/56* | (2006.01) |
| *H01L 25/00* | (2006.01) |
| *H03F 3/21* | (2006.01) |
| *H03F 1/26* | (2006.01) |
| *H03F 1/02* | (2006.01) |

(52) U.S. Cl.
CPC .............. *H01L 23/66* (2013.01); *H01L 21/56* (2013.01); *H01L 21/565* (2013.01); *H01L 23/3121* (2013.01); *H01L 23/552* (2013.01); *H01L 25/0655* (2013.01); *H01L 25/18* (2013.01); *H01L 25/50* (2013.01); *H01L 29/49* (2013.01); *H03F 1/0288* (2013.01); *H03F 1/26* (2013.01); *H03F 3/211* (2013.01); *H01L 2223/6611* (2013.01); *H01L 2223/6644* (2013.01); *H01L 2224/48227* (2013.01); *H01L 2224/97* (2013.01); *H01L 2924/1304* (2013.01); *H01L 2924/141* (2013.01); *H01L 2924/181* (2013.01); *H01L 2924/3025* (2013.01); *H03F 2200/451* (2013.01)

(58) Field of Classification Search
CPC H01L 2224/97; H01L 2924/181; H01L 21/56
See application file for complete search history.

(56) References Cited

U.S. PATENT DOCUMENTS

| | | |
|---|---|---|
| 5,485,037 A | 1/1996 | Marrs |
| 5,608,188 A | 3/1997 | Choon et al. |
| 5,661,337 A | 8/1997 | Manteghi |

(Continued)

*Primary Examiner* — Ngan Ngo
(74) *Attorney, Agent, or Firm* — Charlene R. Jacobsen

(57) ABSTRACT

A semiconductor device package includes an isolation wall located between a first circuit and a second circuit on a substrate. The isolation wall is configured to reduce inductive coupling between the first and second circuits during operation of the semiconductor device. Encapsulation material covers the substrate, first and second circuits, and the isolation wall. The isolation wall has features, such as indentation, along its upper edge that facilitate a flow of the encapsulation material across the isolation wall during fabrication to largely eliminate interior defects and/or visual defects on the surface of the completed semiconductor device package. For a dual-path amplifier, such as a Doherty power amplifier, the isolation wall separates the carrier amplifier elements from the peaking amplifier elements included within the semiconductor device package.

20 Claims, 5 Drawing Sheets

(56) References Cited

U.S. PATENT DOCUMENTS

| | | | | |
|---|---|---|---|---|
| 5,821,605 A | * | 10/1998 | Hong | .................. H01L 24/06 |
| | | | | 257/666 |
| 2002/0047088 A1 | | 4/2002 | Ishii et al. | |
| 2013/0119523 A1 | | 5/2013 | Cheng et al. | |
| 2014/0022020 A1 | | 1/2014 | Aaen et al. | |
| 2014/0161295 A1 | * | 6/2014 | Huang | .................. H04R 1/406 |
| | | | | 381/357 |
| 2014/0167858 A1 | | 6/2014 | van Zuijlen et al. | |
| 2015/0002226 A1 | | 1/2015 | Meen Kuo et al. | |
| 2015/0170986 A1 | | 6/2015 | Szymanowski et al. | |

* cited by examiner

SEMICONDUCTOR PACKAGE WITH ISOLATION WALL

TECHNICAL FIELD OF THE INVENTION

The present disclosure relates generally to semiconductor device packages, and more specifically, to a semiconductor device package incorporating a structure to reduce inductive coupling between adjacent circuits therein.

BACKGROUND OF THE INVENTION

Wireless communication systems often employ power amplifiers for increasing the power of a signal. In a wireless communication system, a power amplifier is usually the last amplifier in a transmission chain (the output stage) and it is the amplifier stage that typically demands the most attention to power efficiency. High gain, high linearity, stability, and a high level of power-added efficiency (i.e., the ratio of the difference between the output power and the input power to DC power) are characteristics of an ideal amplifier.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
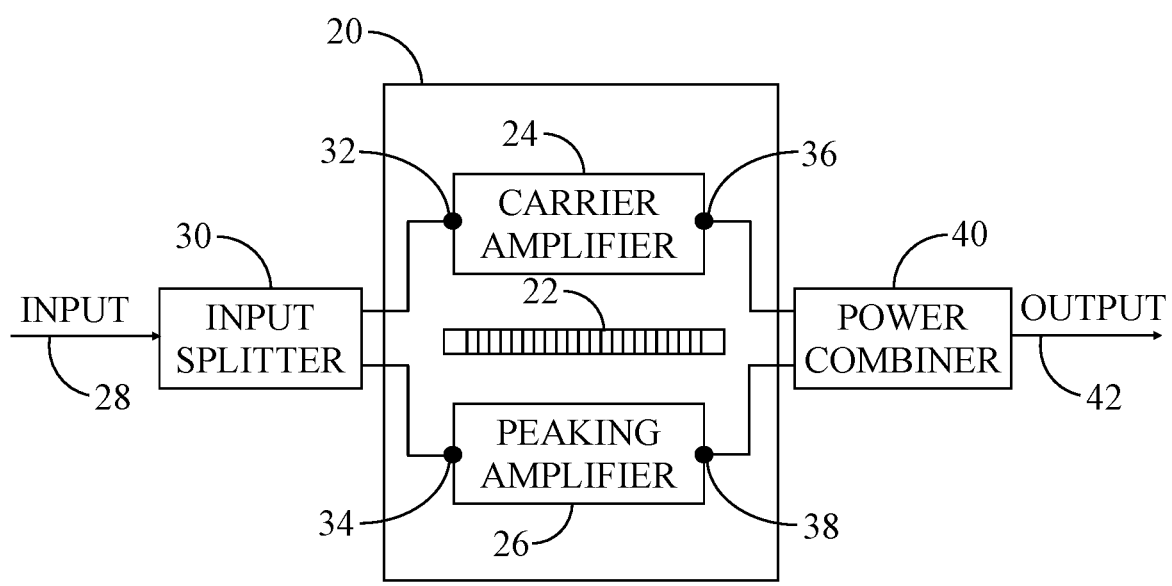
FIG. 1 shows a simplified block diagram of a Doherty power amplifier with an isolation wall.

In overview, embodiments disclosed herein entail a semiconductor device package that incorporates a structure, i.e., an isolation wall, to reduce inductive coupling between elements of a semiconductor device embodied within the package. For a multi-path power amplifier (such as a Doherty power amplifier), an isolation wall that separates carrier amplifier elements from peaking amplifier elements is included within the semiconductor device package. The isolation wall can take the form of a structure that is constructed of a conductive material coupled to ground which separates the elements of the amplifier. Thus, the isolation wall can yield a significant improvement in signal isolation between amplifier elements, thereby improving performance of the multi-path amplifier. Additionally, the isolation wall has a notched profile of indentations along its upper edge that enables a less restricted flow of encapsulation material during fabrication. A less restricted flow of encapsulation material during fabrication may largely eliminate interior defects and/or surface defects on the completed package where visual inspection and part marking is likely to be performed.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. The terms "substantial" and "substantially" herein mean sufficient to accomplish the stated purpose in a practical manner and that minor imperfections, if any, are not significant for the stated purpose.

Referring to FIG. 1, FIG. 1 shows a simplified block diagram of a Doherty power amplifier 20 with an isolation wall 22. Doherty power amplifier 20 includes a first circuit in the form of a carrier amplifier 24 and a second circuit in the form of a peaking amplifier 26. An input signal 28 is split into two signals by an input splitter 30, which may apply a phase delay to one of the signals (e.g., a 90 degree phase delay). One of the resulting input signals is applied to a first input 32 of carrier amplifier 24, and the other input signal is applied to a second input 34 of peaking amplifier 26. Carrier amplifier 24 produces a first output signal at a first output 36 and peaking amplifier 26 produces a second output signal at a second output 38. In a Doherty configuration, first input 32 and the first output 36 may constitute a gate terminal and a drain terminal of carrier amplifier 24, respectively. Similarly, second input 34 and second output 38 may constitute a gate terminal and a drain terminal of peaking amplifier 26, respectively. The first and second output signals are combined through a power combiner 40 to produce a combined output signal 42. Those skilled in the art will recognize that a Doherty power amplifier semiconductor package typically includes additional electronic devices and circuitry not shown herein for simplicity of illustration.

In an embodiment, carrier amplifier 24 is configured to be active for an entire range of output powers of Doherty power amplifier 20. Peaking amplifier 26 is configured to turn on only when carrier amplifier 24 saturates. Peaking amplifier 26 delivers current as carrier amplifier 24 saturates, thereby reducing the impedance seen at the output of carrier amplifier 24. Thus, carrier amplifier 24 delivers more current to the load while carrier amplifier 24 is saturated because of a "load-pulling" effect. Since carrier amplifier 24 remains close to saturation, Doherty power amplifier 20 is able to transmit peak output power so that the total efficiency of the system remains relatively high.

Power combiner 40, operating to combine the first output signal from carrier amplifier 24 with the second output signal from peaking amplifier 26, may include a quarter-wave impedance inverter. The quarter-wave impedance inverter can add a ninety degree lag to the output signal from carrier amplifier 24 or peaking amplifier 26 in order to compensate for the phase delay added by the input splitter to the signal provided to either peaking amplifier 26 or carrier amplifier 24. The phase of the signal provided to peaking amplifier 26 is typically designed to lag that of carrier amplifier 24 by ninety degrees so that the two output signals add in-phase when the output signals are combined at the output of power combiner 40 to form combined output signal 42.

In the exemplary circuit in FIG. 1, each of carrier amplifier 24 and peaking amplifier 26 may include a number of active and passive electrical elements. For example, carrier amplifier 24 may include a first capacitor that couples first input 32 to a first transistor, which applies the appropriate amplification to the first input signal received at first input 32. An output of the first transistor can be connected to a second capacitor. The first and second capacitors operate to condition the first input signal that is amplified by the first transistor. Similarly, peaking amplifier 26 can include a third capacitor coupling second input 34 to a second transistor, which applies the appropriate amplification to the second input signal received at second input 34. An output of the second transistor can be connected to a fourth capacitor. The third and fourth capacitors operate to condition the input second signal that is amplified by the second transistor. Those skilled in the art will recognize that carrier amplifier 24 and peaking amplifier 26 may include additional integrated active and/or passive electronic components not shown herein for simplicity of illustration.

Figure 2:
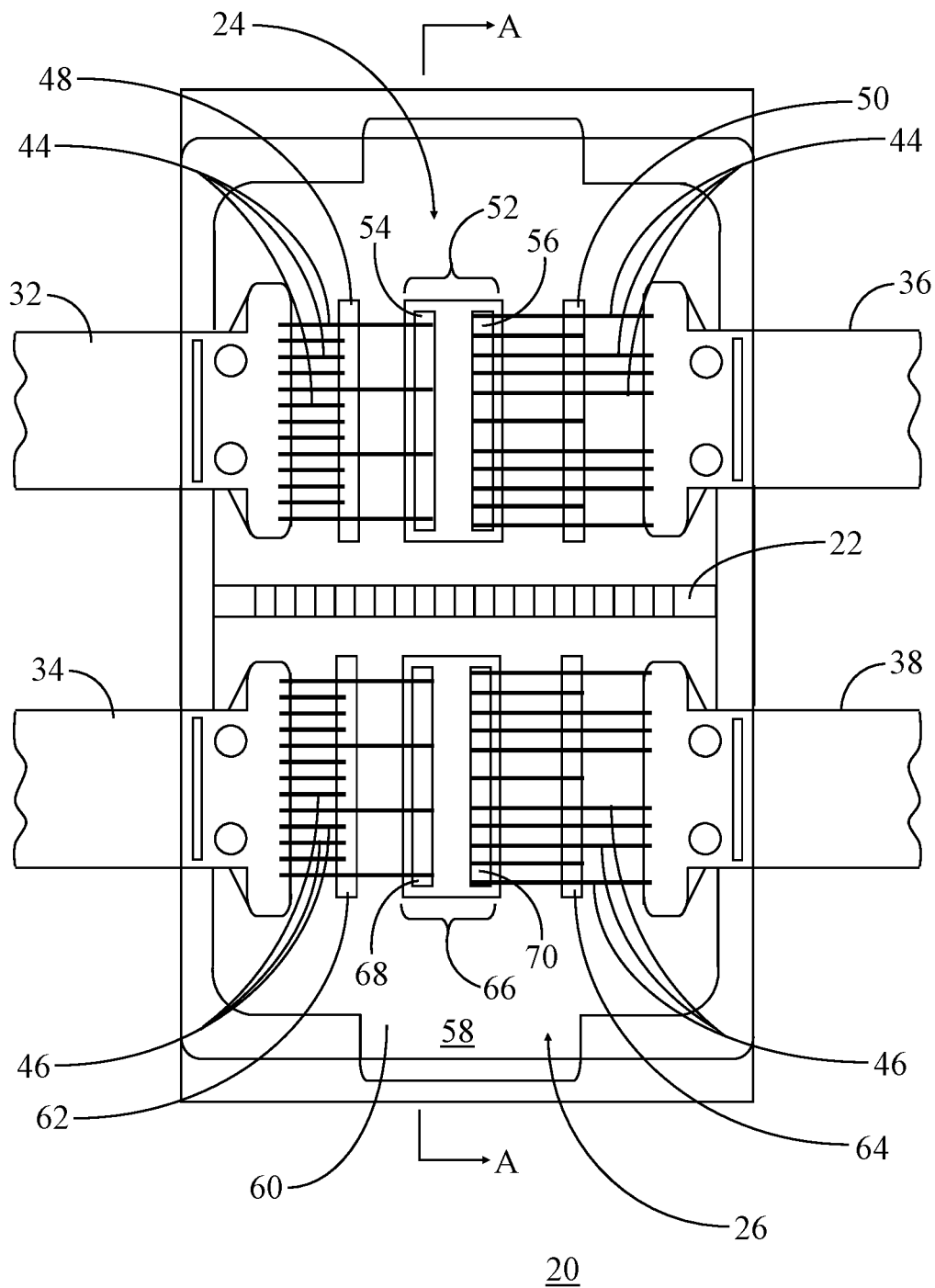
FIG. 2 shows a top schematic view of components of carrier and peaking amplifiers for the Doherty power amplifier of FIG. 1.

FIG. 2 shows a top schematic view of components of carrier and peaking amplifiers 24, 26 for Doherty power amplifier 20. The separate electrical devices making up carrier amplifier 24 and peaking amplifier 26 are connected to one another using multiple arrays of interconnects 44 and 46, sometimes referred to as bond wires. In a practical application, one or more of the signal paths (e.g., between inputs, outputs, capacitors and transistors) of carrier amplifier 24 may be established using a first array of interconnects 44. Likewise, a second array of interconnects 46 may be used to establish one or more of the signal paths of peaking amplifier 26.

Carrier amplifier 24 includes a number of integrated active and/or passive electrical components, such as capacitors 48, 50 and a transistor 52 (having a gate pad 54 and a drain pad 56) manufactured on and/or subsequently mounted to a surface 58 of a common (i.e., single) substrate, such as a package ground plane 60. Capacitors 48, 50 may be, for example, Metal-Oxide-Semiconductor (MOS) capacitors mounted on ground plane 60. Similarly, peaking amplifier 26 includes a number of electrical devices, such as capacitors 62, 64 and a transistor 66 (having a gate pad 68 and a drain pad 70) manufactured on or subsequently mounted to surface 58 of a common (i.e., single) carrier, such as package ground plane 60. Capacitors 62, 64 may be, for example, MOS capacitors mounted on ground plane 60.

The layout of the depicted Doherty power amplifier 20 can result in the components of carrier amplifier 24 being adjacent to corresponding components of peaking amplifier 26. Accordingly, the arrangement of various components of each amplifier (including, specifically, first and second arrays of interconnects 44, 46 carrying high-frequency signals) are adjacent to and geometrically parallel with one another. The adjacent layout of the depicted Doherty power amplifier 20 can result in some inductive coupling between carrier and peaking amplifiers 24, 26 in a planar dimension. More critically, however, the adjacent layout of first and second arrays of interconnects 44, 46 can yield inductive coupling in three dimensions, which can significantly exacerbate the inductive coupling problem and thereby reduce the performance of the overall circuit.

Therefore, Doherty power amplifier 20 includes isolation wall 22 formed between carrier amplifier 24 and peaking amplifier 26 to provide electrical isolation between the circuits, their associated arrays of interconnects, and other components of carrier and peaking amplifiers 24, 26. Isolation wall 22, as described in greater detail below, is constructed as a body between the circuitry of carrier amplifier 24 and the circuitry of peaking amplifier 26. The material of isolation wall 22 suitably conducts, absorbs, or reflects electromagnetic emissions from either or both of carrier amplifier 24 or peaking amplifier 26 thereby preventing the emissions from reaching the other amplifier. Isolation wall 22 may be built on various substrates or a lead frame of the semiconductor device depending upon the particular package design implementation. In various implementations, isolation wall 22 may be connected directly to ground plane 60 or to a ground terminal which may, in turn be connected to a ground potential during operation of Doherty power amplifier 20. In general, the isolation wall 22 operates as a shield to interrupt and prevent the inductive coupling between carrier amplifier 24 and peaking amplifier 26 of Doherty power amplifier 20.

Along with the other components in a semiconductor device package that includes Doherty power amplifier 20, isolation wall 22 may be over molded with a conventional encapsulation material to form a semiconductor device package. During an over molding process, the encapsulation material typically flows from one corner (i.e., mold gate) of a circuit such as Doherty power amplifier 20 over the entire body. Under such a scenario, taller components such as an isolation wall could potentially create an obstacle to the flow pattern of the encapsulation material. A restricted flow pattern could adversely affect adhesion and uniformity of the encapsulation material and/or could produce visual anomalies on the top surface of the semiconductor device package where part marking is typically performed. In accordance with various embodiments described herein, isolation wall 22 is suitably shaped to enable a less restricted flow of encapsulation material during fabrication without adversely affecting the electromagnetic isolation achieved using an isolation wall. An improved flow of encapsulation material during fabrication may improve the quality of encapsulation material adhesion, uniformity of particle dispersion, and may largely eliminate interior and/or surface defects on the completed semiconductor device package.

Figure 3:
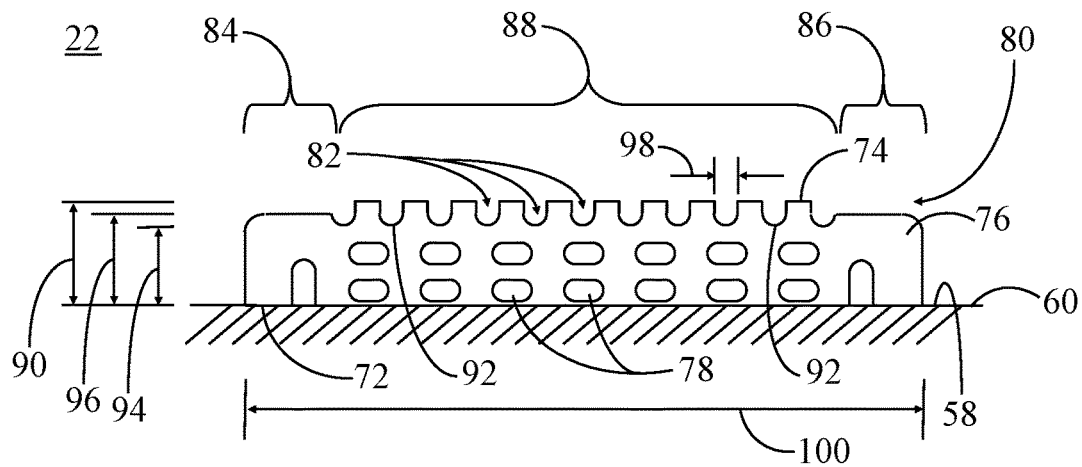
FIG. 3 shows a side view of an isolation wall implemented in the semiconductor device of FIG. 1 in accordance with an embodiment.

FIG. 3 shows a side view of isolation wall 22 implemented in Doherty power amplifier 20 (FIG. 1) in accordance with an embodiment. Isolation wall 22 includes a lower edge 72 and an upper edge 74 spaced apart by a body 76 of electrically conductive material. As will be discussed in greater detail below, lower edge 72 of isolation wall 22 is configured to attach to or otherwise be in electrical communication with ground plane 60. Isolation wall 22 thus extends perpendicularly from surface 58 of ground plane 60. In some configurations, body 76 of isolation wall 22 may have a plurality of small holes 78 through which encapsulation material may flow during the packaging process. The size of holes 78 is sufficiently small so as not to adversely affect the electromagnetic isolation provided by isolation wall 22.

In accordance with an embodiment, upper edge 74 of isolation wall 22 has a notched profile 80 of indentations 82 that extend toward lower edge 72 of isolation wall 72. More particularly, upper edge 74 of isolation wall 22 includes opposing first and second distal regions 84, 86 and a center region 88 interposed between distal regions 84, 86. Indentations 82 are located at center region 88 of isolation wall 22. Upper edge 74 of isolation wall 22 is spaced apart from surface 58 of ground plane 60 by a height 90 and a bottom portion 92 of each of indentations 82 is spaced apart from surface 58 by a height 94 that is less than height 90. As illustrated, first and second distal regions 84, 86 of isolation wall 22 may be spaced apart from surface 58 of ground plane 60 by a height 96 that is less than height 90 of upper edge 74 but greater than height 94 of bottom portion 92 of indentations 82. Each of indentations 82 is characterized by a width 98 that is parallel to a lengthwise dimension 100 of isolation 22. Thus, width 98 is generally the same for each of indentations 82.

The particular notched profile 80 of isolation wall 22 that includes the lower height 96 of first and second distal regions 84, 86 and indentations 82 of a predetermined depth (i.e., the difference between height 90 and height 94) and width 98 facilitates a flow of encapsulation material across isolation wall 22 during fabrication. This less restricted flow of encapsulation material may enable a more uniform distribution of particulates of various sizes within the encapsulation material on opposing sides of isolation wall 22, may improve the quality of encapsulation material adhesion, and may largely eliminate interior and/or visual defects on the surface of the encapsulation material of the completed semiconductor device package where part marking is likely to be performed. However, width 98 of indentations 82 is sufficiently narrow so that isolation wall 22 functions as a solid wall in order to effectively reduce inductive coupling between carrier amplifier 24 (FIG. 1) and peaking amplifier (26).

Figure 4:
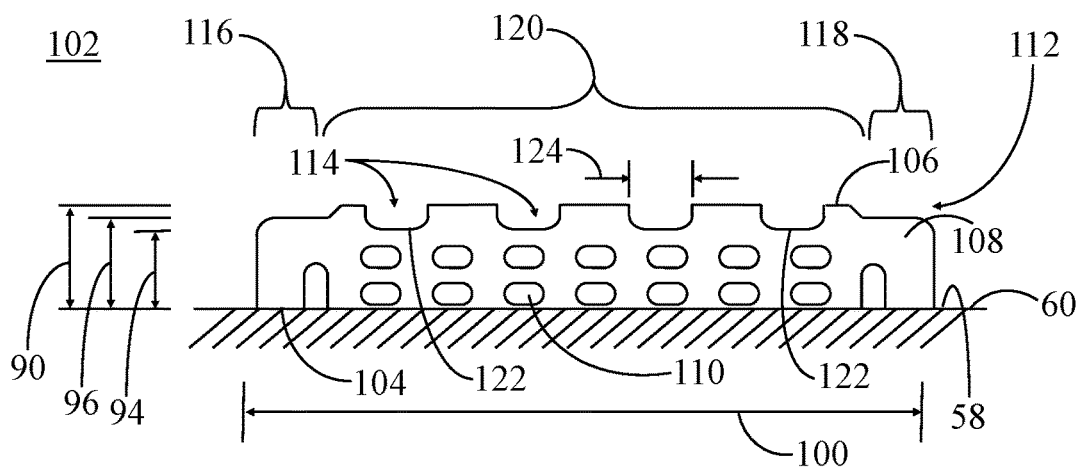
FIG. 4 shows a side view of an isolation wall in accordance with another embodiment.

FIG. 4 shows a side view of an isolation wall 102 in accordance with another embodiment. Isolation wall 102 includes a lower edge 104 and an upper edge 106 spaced apart by a body 108 of electrically conductive material. Like isolation wall 22, lower edge 104 of isolation wall 102 is configured to attach to or otherwise be in electrical communication with ground plane 60 so that isolation wall 102 extends perpendicularly from surface 58 of ground plane 60. Body 108 of isolation wall 102 may additionally include a plurality of small holes 110 through which encapsulation material may flow during the packaging process.

In accordance with an embodiment, upper edge 106 of isolation wall 102 has a notched profile 112 of indentations 114 that extend toward lower edge 104 of isolation wall 102. Again, upper edge 106 includes opposing first and second distal regions 116, 118 and a center region 120 interposed between distal regions 116, 118. Indentations 114 are located at center region 120 of isolation wall 102. Upper edge 106 of isolation wall 102 is spaced apart from surface 58 of ground plane 60 by height 90 and a bottom portion 122 of each of indentations 114 is spaced apart from surface 58 by height 94 that is less than height 90. As illustrated, first and second distal regions 116, 118 of isolation wall 102 may be spaced apart from surface 58 of ground plane 60 by height 96 that is less than height 90 of upper edge 106 but greater than height 94 of bottom portion 122 of indentations 114.

Each of indentations 114 is characterized by a width 124 that is parallel to lengthwise dimension 100 of isolation wall 102. Thus, width 124 is generally the same for each of indentations 114. Isolation wall 102 provides an example in which indentations 114 have width 124 that is greater than width 98 (FIG. 3) of indentations 82 of isolation wall 22 (FIG. 3). The greater width 124 of indentations 114 relative to width 98 of indentations 82 may more effectively enable the flow of encapsulation material across isolation wall 102. However, due to the greater width 124 of indentations 114, such an isolation wall 102 may be implemented in a semiconductor device package in which electrical circuits (e.g., a carrier amplifier and a peaking amplifier) are located at relatively large distances from one another so that electrical performance of the semiconductor device package is not significantly worsened.

Figure 5:
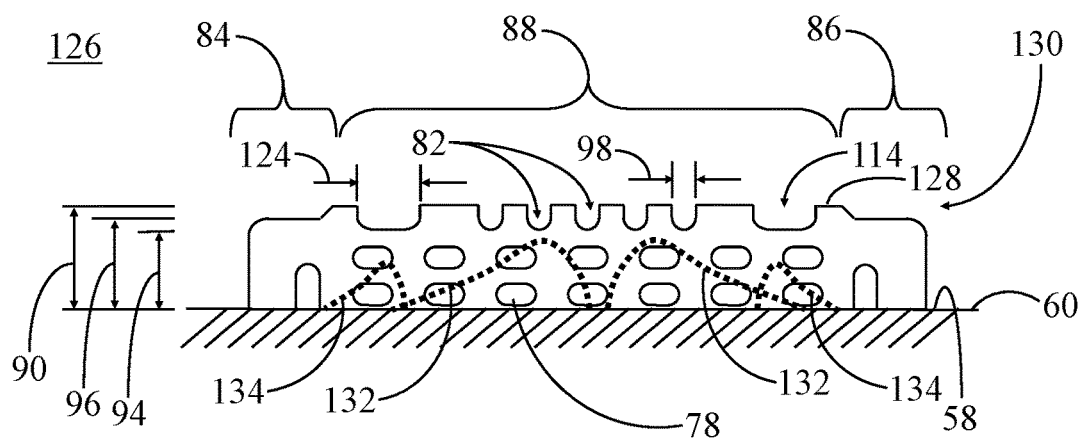
FIG. 5 shows a side view of an isolation wall in accordance with yet another embodiment.

FIG. 5 shows a side view of an isolation wall 126 in accordance with yet another embodiment. FIG. 5 represents a configuration in which an upper edge 128 of isolation wall 126 includes a notched profile 130 having both indentations 82 of width 98 and indentations 114 of width 124. Thus, isolation wall 126 represents a compromise between the features of isolation wall 22 (FIG. 3) and isolation wall 102 (FIG. 4). FIG. 5 further includes dotted lines 132, 134. Dotted lines 132, 134 generally represent a portion of any of interconnects 44, 46 (FIG. 2) that may be included in Doherty power amplifier 20 (FIG. 2). More particularly, dashed lines 132 represent interconnects (e.g., shunt wires) that are taller than the remaining interconnects and dashed lines 134 represent the shorter remaining interconnects. Dashed lines 132, 134 are provided as examples of interconnects of varying heights. However, they do not imply any particular connection to other circuits, to surface 58 of ground plane 60, and the like.

In accordance with the illustrated embodiment, isolation wall 126 may be formed to include the narrower indentations 82 closer to the taller interconnects 132 to provide effective electrical isolation. Additionally, isolation wall 126 may be formed to include the wider indentations 114 at the regions of the shorter interconnects 134 to achieve acceptable electrical isolation while concurrently facilitating the flow of encapsulation material over isolation wall 126.

FIGS. 3-5 are provided to demonstrate various notched profiles of the upper edge of the isolation walls. Other notched profiles may be implemented that provide effective electromagnetic isolation while concurrently facilitating the flow of encapsulation material over isolation wall. The lower edges of any of isolation walls 22, 102, and 126 may take any one of several forms for attachment to a substrate, such as ground plane 60. Thus, FIGS. 6-11 (described below) are provided to demonstrate example attachment techniques. However, other attachment techniques may be implemented as well.

Figure 6:
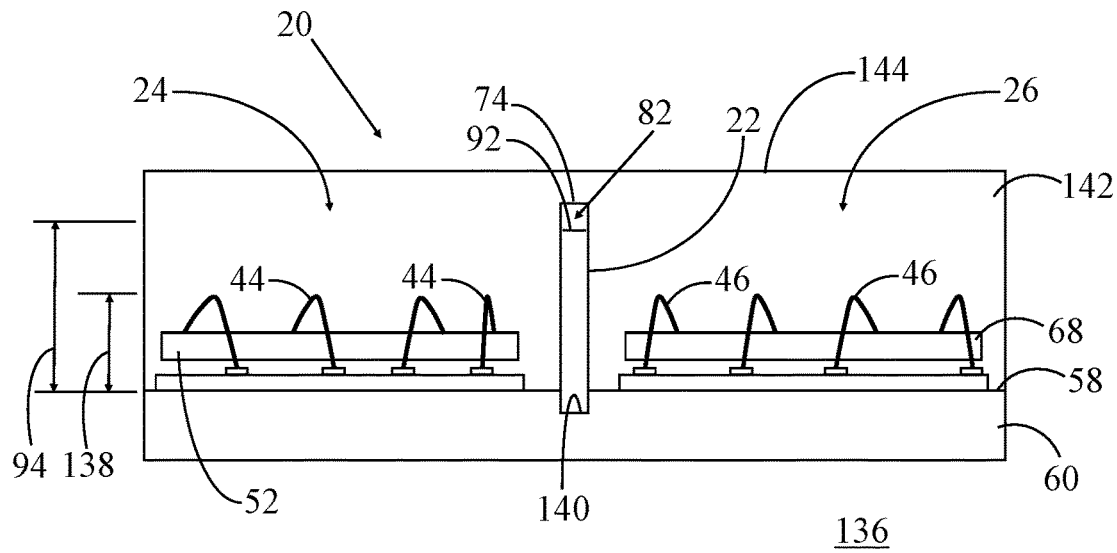
FIG. 6 shows a simplified cross section view taken along line A-A in FIG. 2 showing the Doherty amplifier with an embodiment of the isolation wall in a semiconductor device package.

FIG. 6 shows a simplified cross section view taken along line A-A in FIG. 2 showing Doherty power amplifier 20 with isolation wall 22 in a semiconductor device package 136. Isolation wall 22 is erected between carrier amplifier 24 and peaking amplifier 26 on ground plane 60. According to various embodiments, isolation wall 22 is positioned perpendicular to ground plane 60 and extends some distance above a maximum height 138 of the various components of carrier amplifier 24 and peaking amplifier 26 (and their associated first and second arrays of interconnects 44, 46). By way of example, maximum height 138 may be less than height 94 of bottom portions 92 of indentations 82.

In the embodiment of FIG. 6, electrically conductive isolation wall 22 may be inserted into a slot or aperture 140 in ground plane 60, thereby making electrical connection to ground node in semiconductor device 136. Slot 140 may be formed within ground plane 60 by any suitable etching or material removal process. Thereafter, an encapsulation material 142 (also known as mold compound, molding compound, or encapsulant) covers surface 58 of ground plane 60, carrier and peak amplifiers 24, 26, their associated first and second arrays of interconnects 44, 46, and isolation wall 22. Upper edge 74 of isolation wall 22 may be spaced slightly away from a top surface 144 of semiconductor device package 136 so that some encapsulation material 142 extends across isolation wall 22 as shown in FIG. 6.

Figure 7:
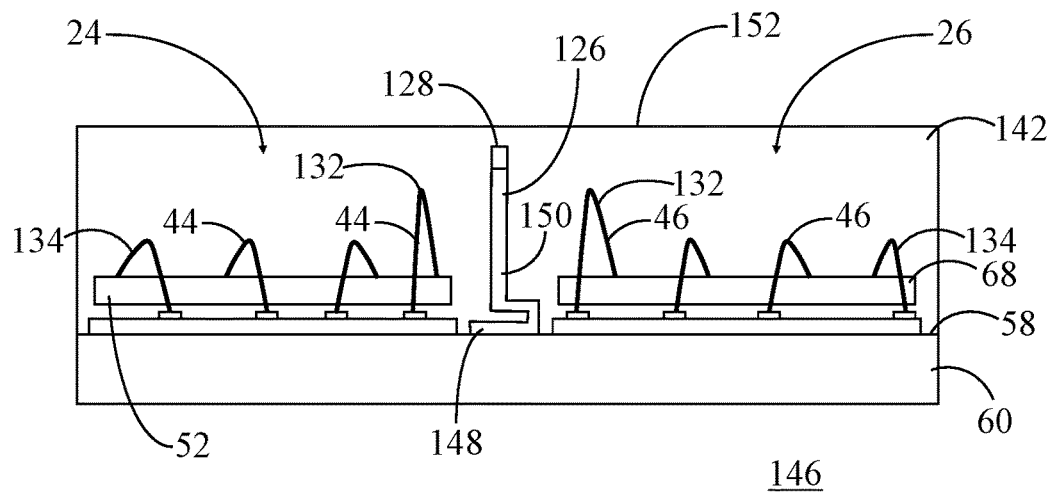
FIG. 7 shows a simplified cross section view taken along line A-A in FIG. 2 showing the Doherty amplifier with another embodiment of the isolation wall a semiconductor device package.

FIG. 7 shows a simplified cross section view taken along line A-A in FIG. 2 showing Doherty power amplifier 20 with isolation wall 126 in a semiconductor device package 146. In this illustrated example, isolation wall 126 includes a bottom section that is bent to form a base 148 extending perpendicular to a body 150 of isolation wall 126. Base 148 supports isolation wall 126 on surface 58 of ground plane 60. Base 148 may, in some cases, be used as a substitute for slot 140 in ground plane 60 as shown in FIG. 6. Base 148 is secured in a manner that establishes electrical contact with ground plane 60, or ground node. For example, base 148 may be soldered, brazed, or attached by an electrically conductive adhesive or epoxy to ground plane 60. Alternatively, any of conductive isolation walls 22 (FIG. 3), 102 (FIG. 4), or 126 may be attached to a ground pad, a ground conductor, or other ground node of the circuitry within any of the semiconductor device packages.

Semiconductor device package 146 is depicted with isolation wall 126 that may include notched profile 130 (best seen in FIG. 5) having wider indentations 114 (FIG. 5) located at regions of shorter interconnects 44, 46 (also labeled 134 to correspond with their depiction in FIG. 5) and narrower indentations 82 at located at regions of taller interconnects 44, 46 (also labeled 132 to correspond with their depiction in FIG. 5). Encapsulation material 142 covers surface 58 of ground plane 60, carrier and peak amplifiers 24, 26, their associated first and second arrays of interconnects 44, 46, and isolation wall 22. Upper edge 128 of isolation wall 126 may be spaced slightly away from a top surface 152 of semiconductor device package 146 so that some encapsulation material 142 extends across isolation wall 126 as shown in FIG. 7.

Isolation wall 22 (depicted in FIG. 6) and isolation wall 126 (depicted in FIG. 7) are both shown in physical contact with ground plane 60. However, an isolation wall need not be in direct physical contact with ground plane 60. In alternative embodiments, isolation wall may be slightly above (i.e., spaced apart from) ground plane 60, but still tied electrically to a common ground node.

Figure 8:
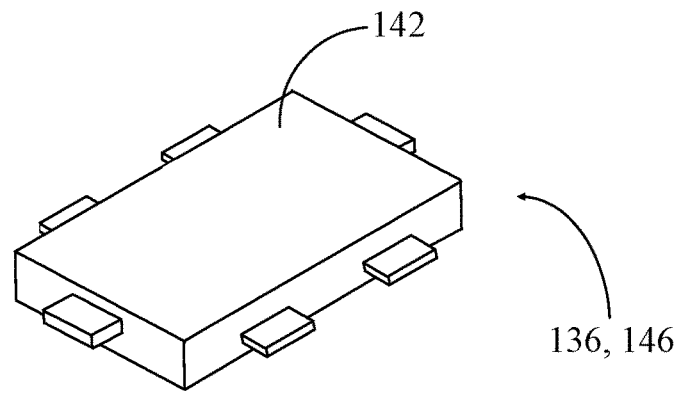
FIG. 8 shows a perspective view of a completed semiconductor device package with the circuitry of FIG. 1 encapsulated in an encapsulation material.

FIG. 8 shows a perspective view of a completed semiconductor device package (e.g., either of semiconductor packages 136, 146) with the circuitry of FIG. 1 encapsulated in encapsulation material 142. Each of the notched profiles of any of isolation walls 22 (FIG. 3), 102 (FIG. 4), or 126 (FIG. 5) facilitates the flow of encapsulation material 142 across isolation wall 126 during fabrication so that the top surface of the semiconductor device package is largely free of surface defects.

Figure 9:
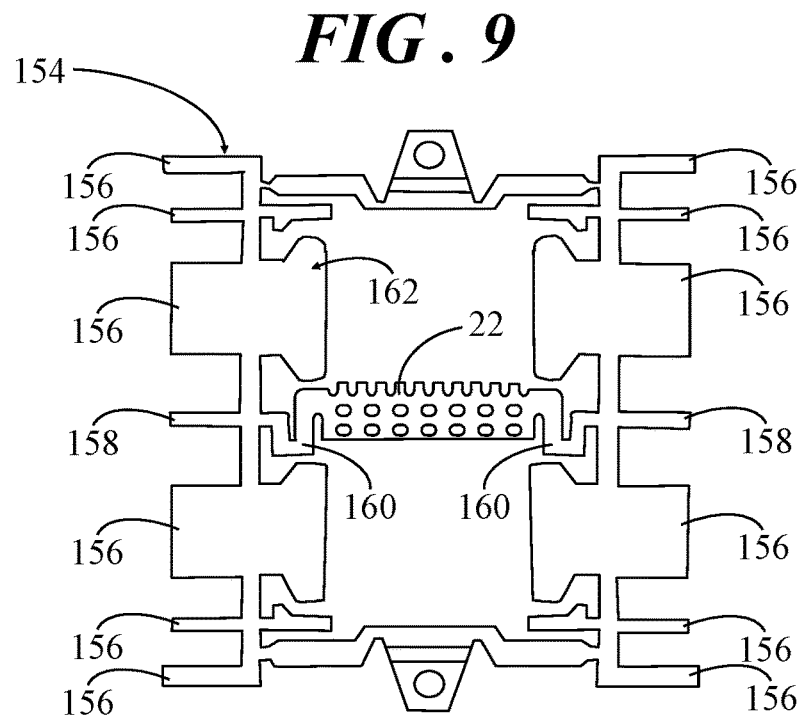
FIG. 9 shows a top view of an embodiment of a lead frame for a semiconductor device package with the isolation wall formed by part of the lead frame.
Figure 10:
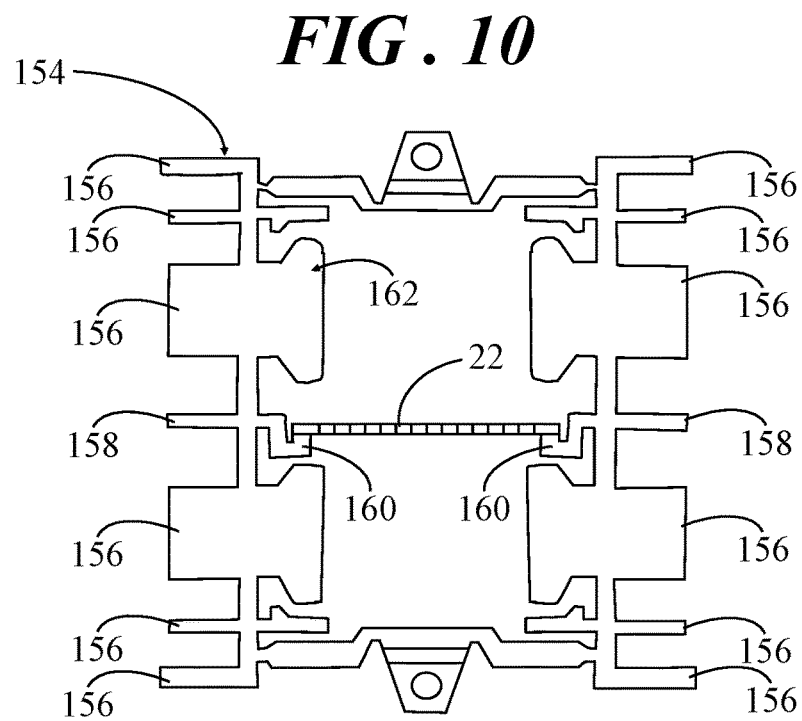
FIG. 10 shows a top view of the lead frame of FIG. 9 with the isolation wall bent upward into a final position.
Figure 11:
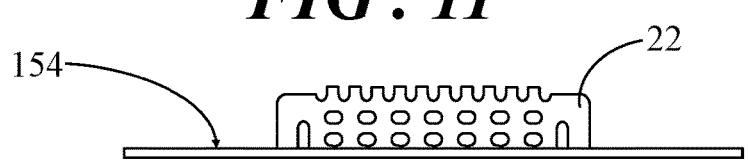
FIG. 11 shows a side view of the lead frame of FIG. 9 with the bent isolation wall.

With reference to FIGS. 9-11, FIG. 9 shows a top view of an embodiment of a lead frame 154 for a semiconductor device package with isolation wall 22 formed by part of lead frame 154. FIG. 10 shows a top view of lead frame 154 with isolation wall 22 bent upward into a final position, and FIG. 11 shows a side view of lead frame 154 with the bent isolation wall 22. Lead frame 154 is fabricated in a conventional manner from a flat electrically conductive sheet.

In an example, lead frame 154 has a plurality of lead fingers 156 and a pair of ground fingers 158 which may be connected to ground node in a semiconductor device package. In other configurations, lead frame 154 may be connected to a ground node through an outside circuit, such as a printed circuit board (PCB). Isolation wall 22 is formed in the center of the lead frame 154 with serpentine links 160 at each end connecting isolation wall 22 to the pair of ground fingers 158. Isolation wall 22 is initially formed coplanar with the remainder 162 of lead frame 154. Prior to assembly of the semiconductor device package, isolation wall 22 is bent transverse to the plane of lead frame 154 as shown in FIGS. 10 and 11. Specifically, isolation wall 22 is twisted by a particular amount (in some embodiments, approximately 90 degrees) about serpentine links 160 into the desired final position of isolation wall 22, which can be perpendicular to the plane of the remainder 162 of lead frame 154. Serpentine links 160 connecting isolation wall 22 to the pair of ground fingers 158 connects isolation wall 22 to ground or a reference potential during operation of the Doherty power amplifier 20 (FIG. 1).

Accordingly, a method of fabricating any of the semiconductor device packages described above entails forming first and second circuits and their corresponding arrays of interconnects on the surface of a substrate, such as a ground plane. An isolation wall (e.g., isolation wall 22 of FIG. 3, isolation wall 102 of FIG. 4, or isolation wall 126 of FIG. 5) is formed, fastened, or otherwise located between the first and second circuits, or at least between the arrays of interconnects. Following locating of the isolation wall between the first and second circuits, the surface of the substrate, their first and second circuits and their corresponding arrays of interconnects, and the isolation wall is covered with encapsulation material.

Although embodiments have been described herein with respect to a Doherty power amplifier with one carrier amplifier and one peaking amplifier, those of skill in the art would understand, based on the description herein, that embodiments of the inventive subject matter may be used in conjunction with virtually any type of multiple path amplifier. Accordingly, the various embodiments are not limited to use with Doherty amplifiers, nor are they limited to use with amplifiers having only two amplification paths. For example, an alternate embodiment may include a device with three or more amplification paths, and isolation walls may be provided between each set of adjacent amplification paths.

In an embodiment, a semiconductor device package comprises a substrate, a first circuit on the substrate, the first circuit comprising a first plurality of electrical components, and a second circuit on the substrate, the second circuit comprising a second plurality of electrical components. An isolation wall is located between the first circuit and the second circuit, the isolation wall extending perpendicularly from a surface of the substrate above a height of the first plurality of components and the second plurality of components, the isolation wall having an upper edge, the upper edge having a notched profile of indentations extending toward the surface of the substrate. Encapsulation material covers the surface of the substrate, the first and second circuits, and the isolation wall.

In another embodiment, a Doherty amplifier package comprises a substrate, a carrier amplifier on the substrate, the carrier amplifier including a first transistor and a first array of wire bonds electrically coupled between the first transistor and a first lead, and a peaking amplifier on the substrate adjacent to the carrier amplifier, the peaking amplifier including a second transistor and a second array of wire bonds electrically coupled between the second transistor and a second lead. An isolation wall is formed of electrically conductive material located between the carrier amplifier and the peaking amplifier, the isolation wall extending perpendicularly from the surface of the substrate above a height of the first and second arrays of wire bonds, the isolation wall having an upper edge, the upper edge having a notched profile of indentations extending toward the surface of the substrate, and the isolation wall being configured to reduce inductive coupling between the carrier amplifier and the peaking amplifier during an operation of the Doherty amplifier. Encapsulation material covers the surface of the substrate, the first and second circuits, and the isolation wall.

In yet another embodiment, a method of fabricating a semiconductor device package comprises forming a first circuit on a surface of a substrate, the first circuit including a first plurality of components, forming a second circuit on the surface of the substrate adjacent to the first circuit, the second circuit including a second plurality of components, and locating an isolation wall of electrically conductive material between the first circuit and the second circuit. The isolation wall extends perpendicularly from a surface of the substrate above a height of the first plurality of components and the second plurality of components, the isolation wall having an upper edge, the upper edge having a notched profile of indentations extending toward the surface of the substrate, the isolation wall being configured to reduce inductive coupling between the first circuit and the second circuit during operation of the semiconductor device. The method further comprises covering the surface of the substrate, the first and second circuits, and the isolation wall with encapsulation material, wherein the covering operation is performed following the locating operation.

Accordingly, a semiconductor device package that reduces inductive coupling between elements of a semiconductor device embodied within the package is described. For a multi-path power amplifier (such as a Doherty power amplifier) an isolation wall that separates carrier amplifier elements from peaking amplifier elements is included within the semiconductor device package. The isolation wall can take the form of a structure that is constructed of a conductive material coupled to ground which separates the elements of the amplifier. Thus, the isolation wall can yield a significant improvement in signal isolation between amplifier elements, thereby improving performance of the multi-path amplifier. Additionally, the isolation wall has a notched profile of indentations along its upper edge that enables a less restricted flow of encapsulation material during fabrication. A less restricted flow of encapsulation material during fabrication may largely eliminate cosmetic defects on the completed package where visual inspection and part marking is likely to be performed.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A semiconductor device package comprising:
   a substrate;
   a first circuit on said substrate, said first circuit comprising a first plurality of electrical components;
   a second circuit on said substrate, said second circuit comprising a second plurality of electrical components;
   an isolation wall located between said first circuit and said second circuit, said isolation wall extending perpendicularly from a surface of said substrate above a height of said first plurality of components and said second plurality of components, said isolation wall having an upper edge, said upper edge having a notched profile of indentations extending toward said surface of said substrate; and
   encapsulation material covering said surface of said substrate and said first and second circuits.

2. The semiconductor device package of claim 1 wherein said height is a first height, said upper edge of said isolation wall is spaced apart from said surface of said substrate by a second height, and a bottom portion of each of said indentations is spaced apart from said surface of said substrate by a third height, said third height being less than said second height.

3. The semiconductor device package of claim 2 wherein said first height of said first plurality of components and said second plurality of components is less than said third height.

4. The semiconductor device package of claim 1 wherein each of said indentations exhibits a width parallel to a lengthwise dimension of said isolation wall, said width being the same for each of said indentions.

5. The semiconductor device package of claim 1 wherein said indentations comprise:
   first indentations, each of said first indentations exhibiting a first width parallel to a lengthwise dimension of said isolation wall; and
   second indentations, each of said second indentations exhibiting a second width parallel to said lengthwise dimension of said isolation wall, said second width being greater than said first width.

6. The semiconductor device package of claim 5 wherein:
said first circuit includes a first transistor and a first array of interconnects electrically coupled between said first transistor and first leads; and
said second circuit includes a second transistor and a second array of interconnects electrically coupled between said second transistor and second leads, said isolation wall is positioned between said first and second arrays of said wire bonds, at least one of said interconnects of said first and second arrays of interconnects is taller than the remainder of said interconnects of said first and second arrays of interconnects, and said first indentations are formed in said isolation wall to be closer to said at least one of said interconnects that is taller than the remainder of said interconnects than said second indentations.

7. The semiconductor device package of claim 1 wherein said height is a first height, said upper edge of said isolation wall includes opposing first and second distal regions and a center region interposed between said first and second distal regions, said indentations are located at said center region of said upper edge of said isolation wall, said upper edge of said isolation wall at said center region is spaced apart from said surface of said substrate by a second height, and first and second distal regions of said upper edge are spaced apart from said surface of said substrate by a third height, said third height being less than said second height.

8. The semiconductor device package of claim 1 further comprising a ground potential node, wherein said isolation wall is electrically connected to said ground potential node.

9. The semiconductor device package of claim 1 wherein:
said first circuit includes a first transistor and a first array of interconnects electrically coupled between said first transistor and first leads;
said second circuit includes a second transistor and a second array of interconnects electrically coupled between said second transistor and second leads, and said isolation wall extends at least between said first and second arrays of interconnects.

10. The semiconductor device package of claim 1 wherein said isolation wall is configured to reduce inductive coupling between said first circuit and said second circuit during operation of at least one of said first and second circuits.

11. The semiconductor device package of claim 1 wherein said isolation wall is formed from a body of electrically conductive material.

12. The semiconductor device package of claim 1 wherein said encapsulation material covers said isolation wall, and said indentations facilitate a flow of said encapsulation material across said isolation wall during fabrication.

13. The semiconductor device package of claim 1 wherein:
said first circuit includes a carrier amplifier of a Doherty amplifier; and
said electrical circuit includes a peaking amplifier of said Doherty amplifier.

14. A Doherty amplifier package comprising:
a substrate;
a carrier amplifier on said substrate, said carrier amplifier including a first transistor and a first array of wire bonds electrically coupled between said first transistor and a first lead;
a peaking amplifier on said substrate adjacent to said carrier amplifier, said peaking amplifier including a second transistor and a second array of wire bonds electrically coupled between said second transistor and a second lead;
an isolation wall formed of electrically conductive material located between said carrier amplifier and said peaking amplifier, said isolation wall extending perpendicularly from said surface of said substrate above a height of said first and second arrays of wire bonds, said isolation wall having an upper edge, said upper edge having a notched profile of indentations extending toward said surface of said substrate, and said isolation wall being configured to reduce inductive coupling between said carrier amplifier and said peaking amplifier during an operation of said Doherty amplifier; and
encapsulation material covering said surface of said substrate, said first and second circuits, and said isolation wall.

15. The Doherty amplifier package of claim 14 wherein each of said indentations exhibits a width parallel to a lengthwise dimension of said isolation wall, said width being the same for each of said indentions.

16. The Doherty amplifier package of claim 15 wherein said indentations comprise:
first indentations, each of said first indentations exhibiting a first width parallel to a lengthwise dimension of said isolation wall; and
second indentations, each of said second indentations exhibiting a second width parallel to said lengthwise dimension of said isolation wall, said second width being greater than said first width, wherein at least one of said interconnects of said first and second arrays of interconnects is taller than the remainder of said interconnects of said first and second arrays of interconnects, and said first indentations are formed in said isolation wall to be closer to said at least one of said interconnects that is taller than the remainder of said interconnects than said second indentations.

17. The Doherty amplifier package of claim 14 wherein said height is a first height, said upper edge of said isolation wall includes opposing first and second distal regions and a center region interposed between said first and second distal regions, said indentations are located along said center region of said upper edge of said isolation wall, said upper edge of said isolation wall at said center region is spaced apart from said surface of said substrate by a second height, and first and second distal regions of said upper edge are spaced apart from said surface of said substrate by a third height, said third height being less than said second height.

18. A method of fabricating a semiconductor device package comprising:
forming a first circuit on a surface of a substrate, said first circuit including a first plurality of components;
forming a second circuit on said surface of said substrate adjacent to said first circuit, said second circuit including a second plurality of components;
locating an isolation wall of electrically conductive material between said first circuit and said second circuit, said isolation wall extending perpendicularly from a surface of said substrate above a height of said first plurality of components and said second plurality of components, said isolation wall having an upper edge, said upper edge having a notched profile of indentations extending toward said surface of said substrate, said isolation wall being configured to reduce inductive coupling between said first circuit and said second circuit during operation of said semiconductor device; and covering said surface of said substrate and said first and second circuits with encapsulation material.

19. The method of claim 18 wherein said covering operation is performed following said locating operation such that said encapsulation material additionally covers said isolation wall.

20. The method of claim 19 wherein said indentations facilitate a flow of said encapsulation material across said isolation wall during said covering operation.

\* \* \* \* \*